(12) United States Patent
Hong et al.

(10) Patent No.: US 6,835,344 B2
(45) Date of Patent: Dec. 28, 2004

(54) PROCESS OF MAKING A THERMOPLASTIC CONTAINER

(75) Inventors: Tung Teck Hong, Singapore (SG); Hideto Aoki, Singapore (SG)

(73) Assignees: Sumitomo Bakelite, Co., Ltd., Tokyo (JP); Sumicarrier Singapore Pte., Ltd., Singapore (SG)

( * ) Notice: Subject to any disclaimer, the term of this patent is extended or adjusted under 35 U.S.C. 154(b) by 401 days.

(21) Appl. No.: 10/007,623

(22) Filed: Dec. 5, 2001

(65) Prior Publication Data

US 2002/0074695 A1 Jun. 20, 2002

(30) Foreign Application Priority Data

Dec. 7, 2000 (SG) ..................................... 200007203-3

(51) Int. Cl.[7] .......................... B29C 51/30; B29C 51/42
(52) U.S. Cl. ..................................................... 264/322
(58) Field of Search ........................................ 264/322

(56) References Cited

U.S. PATENT DOCUMENTS 5,234,104 A 8/1993 Schulte et al.
5,979,660 A 11/1999 Pakeriasamy et al.

FOREIGN PATENT DOCUMENTS

| EP | 0 957 042 A1 | 11/1999 |
| JP | 10-120077 A | 5/1998 |
| JP | 10-139089 A | 5/1998 |
| JP | 10-146884 A | 6/1998 |

*Primary Examiner*—Leo B. Tentoni
(74) *Attorney, Agent, or Firm*—Smith, Gambrell & Russell, LLP

(57) ABSTRACT

A recess of a thermoplastic resin container is formed by urging a part of a thermoplastic resin sheet into a cavity of a mold after heating the part of the thermoplastic resin sheet, so that a bottom portion and side walls of the recess are formed, wherein a bottom of the cavity has a convex shape area protruding in a depth direction away from the base portion formed on another part of the thermoplastic resin on the mold.

9 Claims, 4 Drawing Sheets

PROCESS OF MAKING A THERMOPLASTIC CONTAINER

BACKGROUND OF THE INVENTION AND RELATED ART STATEMENT

The present invention relates to a method and mold for producing a thermoplastic resin container, particularly usable as a thermoplastic resin tape-shaped carrier having recesses for containing respectively electric elements such as integrated circuit chips.

In the prior art, a recess of a thermoplastic resin container for containing an element is formed by urging pneumatically a part of a thermoplastic resin sheet into a cavity of a mold.

OBJECT AND SUMMARY OF THE INVENTION

An object of the present invention is to provide a method and mold for producing a thermoplastic resin container, by which method and mold a flatness at a bottom of a recess of the thermoplastic resin container is improved.

According to the present invention, a method for producing a thermoplastic resin container including a base portion, a pair of side walls extending from the planar base portion, and a bottom portion extending between the side walls with a distance between the base portion and the bottom portion in a thickness direction of the bottom portion so that a recess for containing an element is formed, comprises the step of urging a part of a thermoplastic resin sheet into a cavity of a mold after heating the part of the thermoplastic resin sheet, so that the bottom portion and the side walls are formed with the distance, wherein a bottom of the cavity has a convex shape area protruding in a depth direction away from the base portion formed on another part of the thermoplastic resin sheet on the mold.

According to the present invention, a mold for producing, from a thermoplastic resin sheet, a container including a base portion, a pair of side walls extending from the planar base portion, and a bottom portion extending between the side walls with a distance between the base portion and the bottom portion in a thickness direction of the bottom portion, comprises a cavity adapted to receive a part of the thermoplastic resin sheet after heating the part of the thermoplastic resin sheet, so that the bottom portion and the side walls are formed in the cavity with the distance so that a recess of the container for receiving therein an element is formed, and a planar base area being adjacent to the cavity and surrounding the cavity, wherein a bottom of the cavity has a convex shape area protruding in a depth direction away from the planar base area.

Since the bottom of the cavity has the convex shape area protruding in the depth direction away from the base portion formed on the another part of the thermoplastic resin sheet surrounding the recess, a flatness at the bottom portion after the thermoplastic resin container is cooled to an atmospheric temperature is improved in spite of thermal stress and/or deformation of the thermoplastic resin sheet after the thermoplastic resin sheet is deformed to form the container.

When a depth of the cavity in the depth direction is larger than the distance, the bottom portion is restrained from being protruding in a direction opposite to the depth direction so that the flatness at the bottom portion after the thermoplastic resin container is cooled to the atmospheric temperature is improved. It is preferable that the convex shape is a dome shape, truncated conical shape or truncated pyramid shape. A main area of the bottom portion may extend substantially parallel to the base portion. It is preferable for improving the flatness that a difference in depth between a top of the convex shape and a base thereof in the direction away from the planar base portion is 0.1–1 mm. The thermoplastic resin container may be adapted to contain a ball grid allay electric element.

When the distance is decreased to become less than the depth of the cavity after the distance becomes equal to the depth of the cavity and/or when the distance is decreased after the bottom portion contacts with the bottom of the cavity, the flatness is effectively improved. When the bottom of the cavity has a planar area being adjacent to the convex shape area and surrounding the convex shape area and/or the convex shape area has a planar area at a top thereof, the flatness is further improved.

BRIEF DESCRIPTION OF THE DRAWINGS

FIG. 5b is a side view showing the container of FIG. 5a.

FIG. 5c is a cross-sectional view taken along Vc—Vc face in FIG. 5a.

FIG. 6b is a cross sectional view taken along VIb—VIb face in FIG. 6a.

DETAILED DESCRIPTION OF PREFERRED EMBODIMENTS

Figure 1:
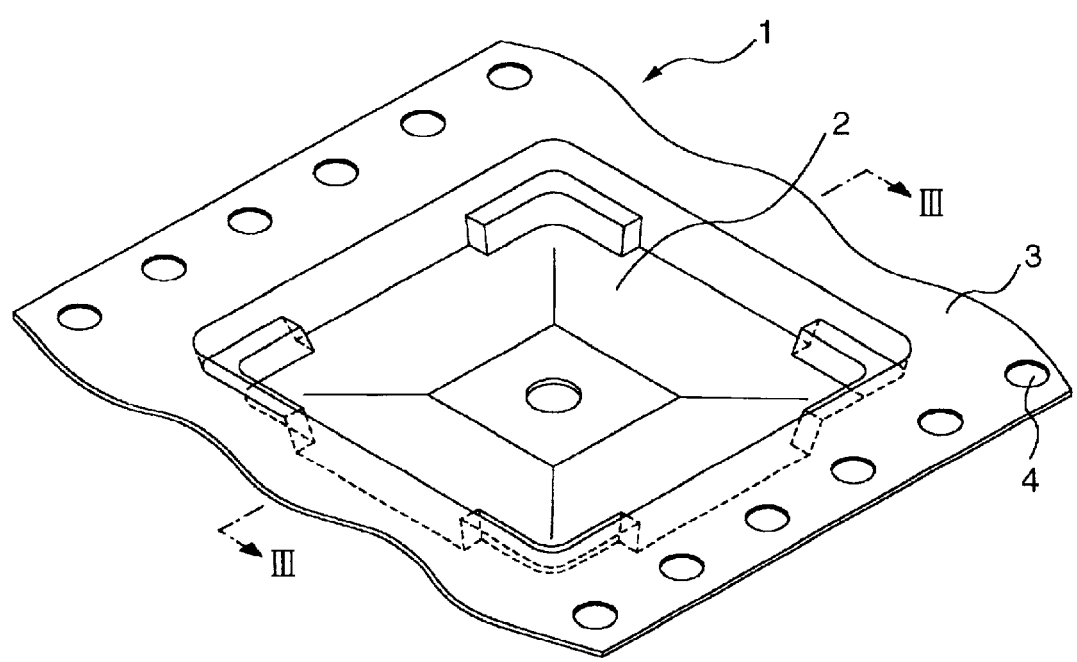
FIG. 1 is an oblique projection view showing a container (element carrier tape) of the invention.
Figure 2:
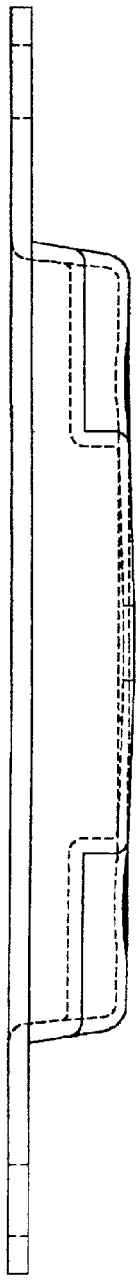
FIG. 2 is a side view showing the container.
Figure 3:
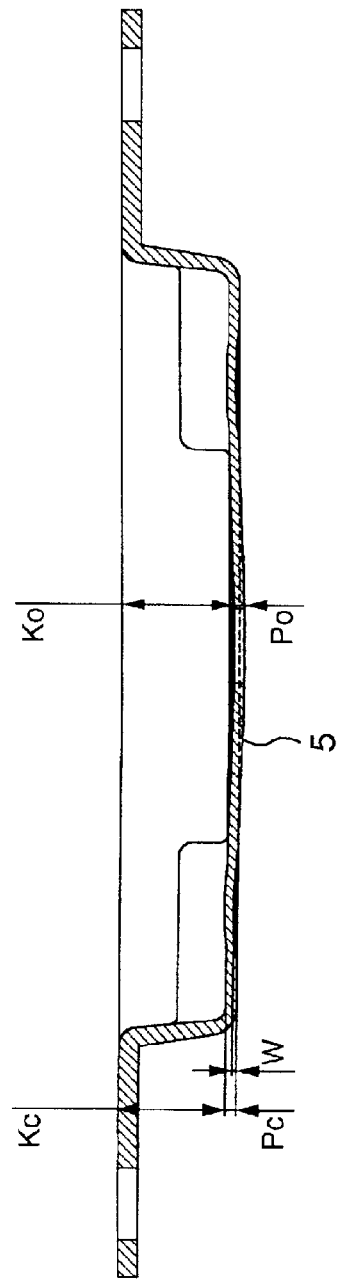
FIG. 3 is a cross-sectional view taken along III—III face in FIG. 1.
Figure 4:
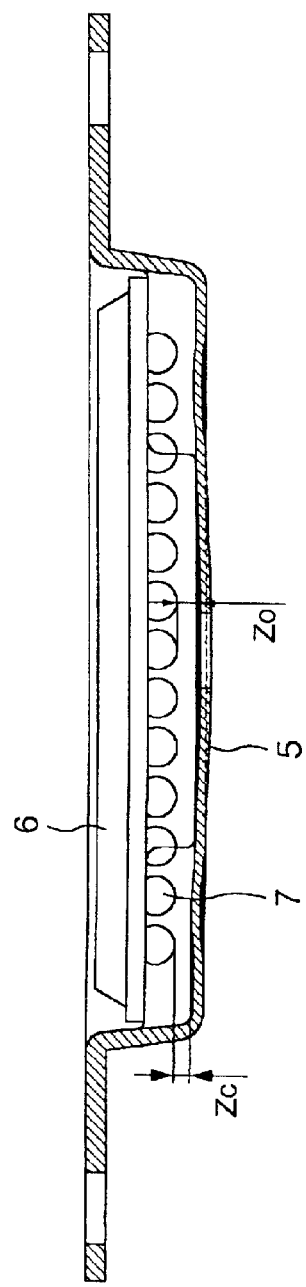
FIG. 4 is a cross-sectional view showing the container receiving therein an electric element such as ball grid allay electric element.
Figure 5A:
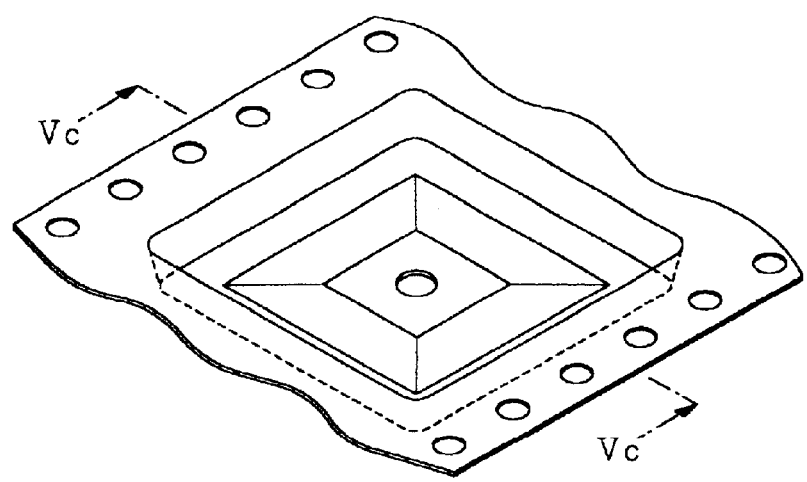
FIG. 5a is an oblique projection view showing another container (element carrier tape) of the invention.
Figure 5B:
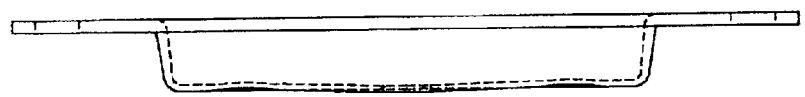
Figure 5C:
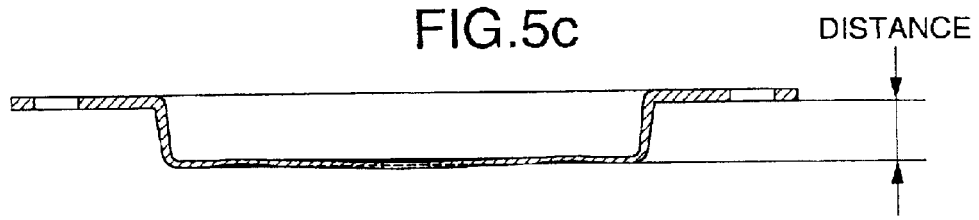
Figure 6A:
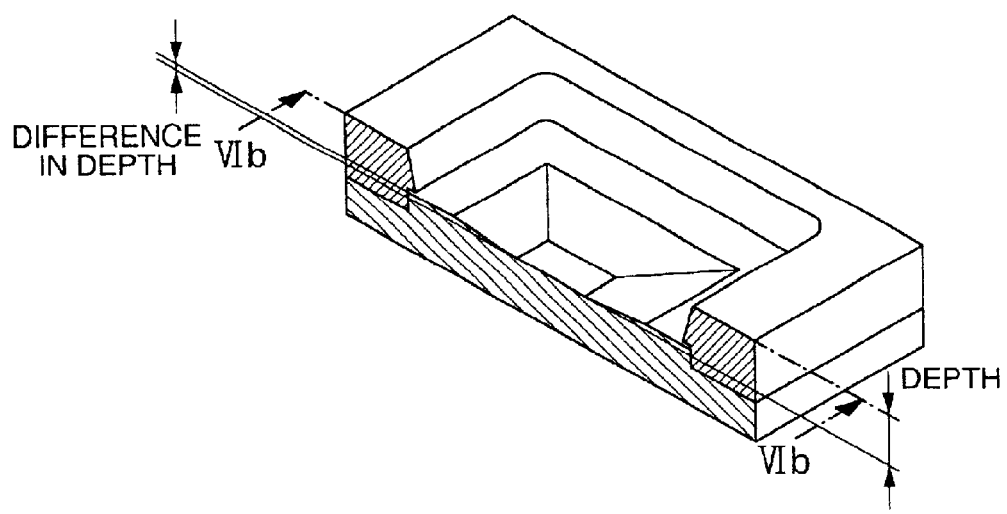
FIG. 6a is an oblique projection view showing a mold of the invention.
Figure 6B:
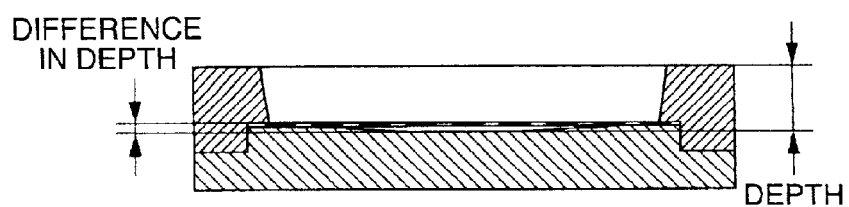

As shown in FIG. 1, a container 1 used as a carrier tape for an electric element such as SOP (small outline package), SSOP (shrink small outline package), TSOP (thin small outline package), TSSOP (thin shrink small outline package), PLCC (plastic leaded chip carrier), QFP (quad flat package), BGA (ball grid allay) or the like and made of a flexible resin has recesses (embossed areas) 2 including the claimed side walls and bottom portion, and a flange 3 as the claimed base portion. The recesses 2 are aligned along a longitudinal direction of the carrier tape with a constant interval and can receive therein respective electric elements. A tape-shaped cover (not shown) is adhered to the flange 3 to cover the recesses so that the electric elements are prevented from being removed from the recesses, and tape feeding holes 4 are arranged along the longitudinal direction at at least one of sides of the flanges. The recesses 2 are formed by urging pneumatically (with pressure difference by vacuuming or pressurizing air) parts of a thermoplastic resin sheet into respective cavities of a mold.

When the cavity of the mold has an area of 27 mm×27 mm and a depth of 3 mm, a bottom of the cavity has at a center thereof a truncated quadrangular pyramid convex shape dent of 0.3 mm height with a top planar area of 26 mm×26 mm, and a polystyrene sheet of 0.3 mm thickness is urged pneumatically into the cavity after being heated to 180° C. so that the recess is formed, Ko=3.05 mm, Kc=3.10 mm, Po=0.28 mm, and Pc=0.20 mm, while Ko is a depth of the recess at a center thereof between an upper surface of the flange 3 and the center thereof, Kc is a depth of the recess at a periphery thereof between the upper surface of the flange 3 and the periphery thereof, Po is a thickness of the sheet at the center thereof, and Pc is a thickness of the sheet at the periphery thereof.

A warp $W=(Kc+Pc)-(Ko+Po)=-0.03$ mm

Therefore, the warp W is significantly small.

When the recess receives therein a BGA package,

Zo=0.45 mm, and Zc=0.5 mm, while Zo is a difference between a height of the BGA package received in the recess and the depth of the recess at the center of the recess, and Zc is a difference between the height of the BGA package and the depth of the recess at the periphery of the recess.

When the truncated quadrangular pyramid convex shape dent is not included by the cavity of the mold as described above, Ko=2.75 mm, Kc=3.10 mm, Po=0.28 mm, Pc=0.20 mm, $W=(Kc+Pc)-(Ko+Po)=0.27$ mm, Zo=0.15 mm, and Zc=0.5 mm.

Therefore, Zo is significantly small so that the BGA package may be easily damaged.

What is claimed is:

1. A method for producing a thermoplastic resin container including a base portion, side walls extending from the base portion, and a bottom portion extending between the side walls with a distance between the base portion and the bottom portion in a thickness direction of the bottom portion, comprising the step of:

urging a part of a thermoplastic resin sheet into a cavity of a mold after heating the part of the thermoplastic resin sheet, so that the bottom portion and the side walls are formed with the distance, wherein a bottom of the cavity has a convex shape area protruding in a depth direction away from the base portion formed on another part of the thermoplastic resin sheet on the mold, wherein a difference in depth between a top of the convex shape and a base thereof in the depth direction away from the base portion is 0.1–1 mm.

2. A method according to claim 1, wherein the depth of the cavity in the depth direction is larger than the distance.

3. A method for producing a thermoplastic resin container including a base portion, side walls extending from the base portion, and a bottom portion extending between the side walls with a distance between the base portion and the bottom portion in a thickness direction of the bottom portion, comprising the step of:

urging a part of a thermoplastic resin sheet into a cavity of a mold after heating the part of the thermoplastic resin sheet, so that the bottom portion and the side walls are formed with the distance, wherein a bottom of the cavity has a convex shape area protruding in a depth direction away from the base portion formed on another part of the thermoplastic resin sheet on the mold, wherein the convex shape is a truncated conical shape or truncated pyramid shape.

4. A method according to claim 1, wherein a main area of the bottom portion extends substantially parallel to the base portion.

5. A method according to claim 1, wherein the thermoplastic resin container is adapted to contain a ball grid array electric element.

6. A method according to claim 1, wherein the distance is decreased to become less than the depth of the cavity after the distance becomes equal to the depth of the cavity.

7. A method according to claim 1, wherein the distance is decreased after the bottom portion contacts with the bottom of the cavity.

8. A method for producing a thermoplastic resin container including a base portion, side walls extending from the base portion, and a bottom portion extending between the side walls with a distance between the base portion and the bottom portion in a thickness direction of the bottom portion, comprising the step of:

urging a part of a thermoplastic resin sheet into a cavity of a mold after heating the part of the thermoplastic resin sheet, so that the bottom portion and the side walls are formed with the distance, wherein a bottom of the cavity has a convex shape area protruding in a depth direction away from the base portion formed on another part of the thermoplastic resin sheet on the mold, wherein the bottom of the cavity has an annular planar area being adjacent to the convex shape area and surrounding the convex shape area.

9. A method according to claim 1, wherein the convex shape area has a planar area at a top thereof.

\* \* \* \* \*